United States Patent [19]

Almasi et al.

[11] 4,271,485
[45] Jun. 2, 1981

[54] BUBBLE DOMAIN STORAGE USING IMPROVED TRANSFER SWITCH

[75] Inventors: George S. Almasi, Katonah; Wilhelm E. Bogholtz, Wappingers Falls; George E. Keefe, Montrose, all of N.Y.

[73] Assignee: International Business Machines Corporation, Armonk, N.Y.

[21] Appl. No.: 937,612

[22] Filed: Aug. 28, 1978

Related U.S. Application Data

[63] Continuation of Ser. No. 709,358, Jul. 28, 1976, abandoned.

[51] Int. Cl.³ .............................................. G11C 19/08
[52] U.S. Cl. .......................................... 365/16; 365/8; 365/34; 365/39
[58] Field of Search ............................. 365/15, 16, 39

[56] References Cited

U.S. PATENT DOCUMENTS

3,713,116  1/1973  Bonyhard et al. ..................... 365/15

OTHER PUBLICATIONS

IBM Technical Disclosure Bulletin by Chang et al., vol. 18, No. 11, Apr. 1976, pp. 3856-3858.
IBM Technical Disclosure Bulletin by Keefe, vol. 17, No. 5, Oct. 1974, p. 1535.
IBM Technical Disclosure Bulletin by Hendel et al., vol. 15, No. 8, Jan. 1973, p. 2649.

Primary Examiner—James W. Moffitt
Attorney, Agent, or Firm—Jackson E. Stanland

[57] ABSTRACT

A magnetic bubble domain storage device comprising a plurality of storage shift registers and at least one major shift register, which serves to provide bubble domains to the storage register and to receive bubble domains from the storage registers. A novel transfer switch, or gate, is located between each of the storage registers and the major register, which is typically configured in the conventional major/minor loop type of storage organization. This transfer switch can be made using single level masking or multiple level masking and is characterized in that the locus of bubble domain propagation paths through the switch element generally defines the letter "Y". These propagation paths are from one arm of the Y to the other arm, from one arm of the Y to the stem or base portion, or the reverse where a bubble domain travels from the stem (base) of the Y to one of the arms of the Y. In a particular embodiment, the transfer switch is comprised of a Y-shaped magnetic element having a current carrying conductor which crosses the stem portion of the Y-shaped magnetic element. The particular path travelled by bubble domains through the transfer switch is determined by the presence or absence of a current through the conductor. Thus, the transfer switch is characterized by at least one magnetic element having a current path crossing the stem portion of the element(s). The exact shape, width, length, and thickness of the magnetic element, or elements, of the transfer switch can be chosen by the designer in accordance with the propagation structures that are desired. What is important is that the plurality of paths which the bubbles can follow generally define a Y, where the current path through the transfer switch crosses the path which is along the stem portion of the Y defined by the plurality of propagation paths available.

24 Claims, 9 Drawing Figures

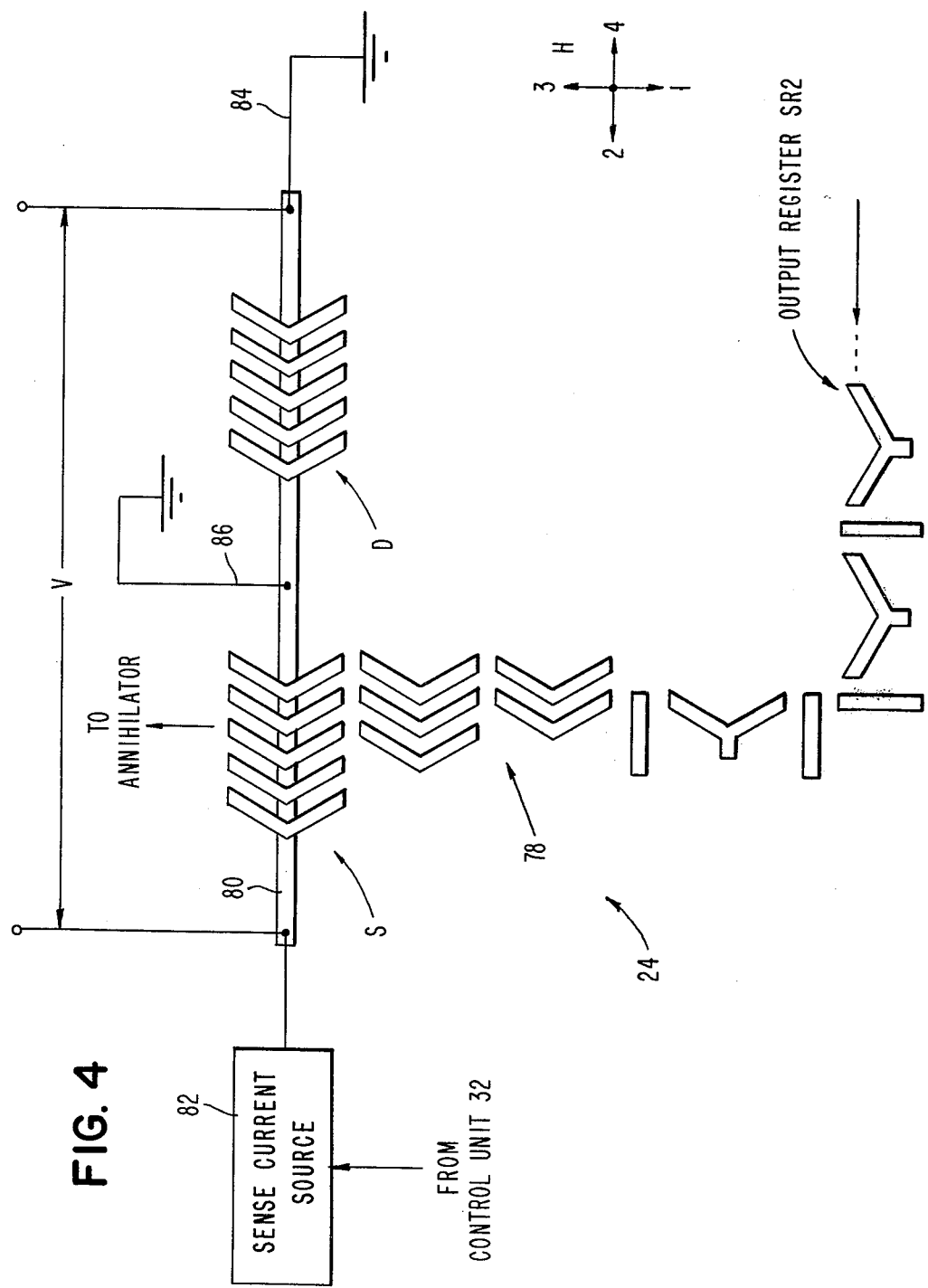

BUBBLE DOMAIN STORAGE USING IMPROVED TRANSFER SWITCH

This is a continuation of application Ser. No. 709,358 filed July 28, 1976 now abandoned.

BACKGROUND OF THE INVENTION

1. Field of the Invention

This invention relates to magnetic bubble domain devices, and more particularly to a bubble storage device and a transfer switch for transferring bubble domains betwen different shift registers, where the transfer switch can be made by a single level masking process and is particularly suitable for reliable transfer of very small bubble domains using very low currents.

2. Description of the Prior Art

Magnetic bubble domain devices are well known in the art, and in many of these devices it is necessary to tranfer bubble domains from one shift register to another. For example, in a major/minor loop type of memory organization, such as is shown in U.S. Pat. No. 3,618,054, bubble domains are transferred between the input/output major loop and the storage minor loops.

Many devices have been described in the prior art for transferring bubble domains from one shift register to another. However, as the size of the magnetic bubble decreases, the design of a proper switch becomes more difficult. Thus, while many current controlled transfer switches are described in the prior art, it is difficult to find one which will work properly when bubble domains of very small size, such as one micron and less in diameter, are used.

In general, a good current controlled transfer switch is one which has very low current amplitude requirements even when extremely small bubble domains are used. This is very important since, as the size of the bubble domains decreases, the linewidth of elements used to move the bubbles also decreases and, if the currents required are too large, problems such as electromigration will occur.

Additionally, a good transfer switch should be compatible with conventional propagation elements used to move bubble domains in shift registers, and should be such that its design is compatible with the design used for the propagation elements in the shift registers. Further, a switch which can be used for all functions on the magnetic chip is desirable. A switch capable of symmetrical transfer should operate with the same margins regardless of the direction of transfer. Another important criterion for a good transfer switch is that it provide good margins for switching and be reliable in its operation regardless of the manner in which it is fabricated. Desirably, it should be capable of being fabricated by single level metallurgy processes using only one critical masking step. Still further, it is desirable that the transfer switch be an integral part of the propagation structure used to move magnetic bubble domains.

In the prior art, various bubble domain transfer switches are described using current carrying overlays to switch bubble domains from one propagation track to another in response to an electrical signal pulse. Typically, the current carrying conductors are designed in a loop configuration so that a current pulse in the conductor will generate a localized magnetic field within the loop. This localized field temporarily adds to the fields of the propagation elements in that region and provides an additional attractive or repulsive force on magnetic bubble domains approaching that region. In this manner, the bubble domain is preferentially attracted or repulsed in order to determine the propagation track along which it will move. A representative example of such a switch is shown in the IBM Technical Disclosure Bulletin, Volume 15, No. 2, July 1972 at page 703. In that switch, bubble domains arrive at a point of ambiguity where two possible positions are available for subsequent bubble domain movement. Current in a conductor determines which path will be taken by the bubble, thus resolving the ambiguity of the switch.

A replicate type of switch using a current carrying loop is described by Bobeck et al in IEEE Transactions on Magnetics, Vol. MAG-9, No. 3, September 1973, at pages 474–480. In this type of switch, current is used to sretch a bubble domain so that it will transfer to a different propagation channel, while an additional amount of current is used to replicate the stretched domain. This type of switch requires high currents and is difficult to incorporate in a single level metallurgy design.

Another version of the replicate switch described in the previous paragraph has been shown by T. J. Nelson, in AIP Conference Proceedings, 18, 95(1974). This is an all-permalloy switch in which a current conducting path is comprised of permalloy deposited at the same time as the permalloy propagation elements. Transfer from one propagation channel to another utilizes a current along a straight permalloy path linking the propagation channels. A disadvantage of this transfer switch is that very high currents are required when the bubble diameter is small, of the order of one micron and less in diameter. Physically, this switch is large and thus is not compatible with densely packed major/minor loop designs.

Still another transfer switch employing a current carrying conductor is shown in U.S. Pat. No. 3,876,995. A double loop conductor is used to establish a magnetic field which attracts a bubble toward one propagation track and at the same time establishes another magnetic field tending to repel the bubble from another propagation track. Additionally, this patent shows a transfer switch which uses no current. Instead, two bubble propagation tracks merge at a junction.

In order to overcome the disadvantages of the prior art transfer switches, a new design for a transfer switch is described herein. The switch can be fabricated using single level metallurgy, and is particularly advantageous when very small magnetic bubble domains are to be transferred. The switch uses very little current even for transfer of very small magnetic domains, and the structure of the magnetic elements comprising the switch is compatible with propagation elements presently used, so that the transfer switch itself can be integral with a propagation path.

Accordingly, it is a primary object of the present invention to provide a transfer switch for magnetic bubble domains, which can be made by single level metallurgy and which requires very small currents for transfer, even when the magnetic bubble domains are very small.

It is another object of the present invention to provide a transfer switch for magnetic bubble domains which is an integral part of the propagation structure used to move such domains, and which provides reliable transfer of the bubble domains.

It is another object of the present invention to provide a switch for transferring magnetic bubble domains between one shift register and another, where the switch provides transfer with very good margins in all propagation paths through the switch.

It is another object of the present invention to provide a magnetic bubble domain transfer switch which can be fabricated by single level metallurgy, and which does not require a transfer current carrying conductor having a loop therein, where the transfer switch can be used with many types of known propagation elements.

BRIEF SUMMARY OF THE INVENTION

A magnetic bubble domain storage device is described in which a plurality of storage registers are selectively and controllably connected to a register, or a plurality of registers, which serve to provide input/output functions. The input/output registers are used for bringing in new information to be placed in the storage registers or for removing information to be read from the storage registers. In particular, a major/minor loop storage arrangement of the type generally described in U.S. Pat. No. 3,618,054 is utilized to illustrate the present invention.

The entire storage system can be fabricated by a process using only one critical masking step. In such a process and device, the most critical patterns of the storage system are the switches used to transfer bubble domains between the major and minor loops. The transfer switches, or gates, of this application provide reliable transfer of bubble domains and provide good transfer margins. Additionally, they operate with very low currents and can be used advantageously for the movement of small bubble domains. They are compatible with any type of propagation element used in any of the storage registers and major registers, and provide symmetrical switching. That is, transfers in either direction between any two registers are reliable and have the same operating margins. These transfer switches provide bubble domain paths which generally define the letter "Y". That is, one propagation path is along one arm of the Y and then along the other arm, while another propagation path is along one arm of the Y and then along the stem or base of the Y. Bubble domains can be transferred in a reverse direction also, where they travel from the stem of the Y to either one of the arms of the Y.

The particular path followed by a bubble domain is determined generally by the presence or absence of a current passing through the transfer switch. The path for this current crosses the bubble domain path which is along the stem of the Y. Depending upon the design layout of the magnetic element or elements used in the switch, various paths can be chosen in the presence or absence of the current.

The transfer switch itself is comprised of at least one magnetic element, such as a magnetic overlay of NiFe, which sends bubble domains along paths characterizing the letter Y. A current carrying conductor provides a current path which generally crosses the stem portion of the Y.

In one embodiment, a single magnetic element is in the shape of a Y and a current carrying conductor crosses the stem portion of the Y. The conductor can lie below the magnetic material forming the Y, above the magnetic material, or be sandwiched between two magnetic layers. In another embodiment, the conductor can be co-planar with the magnetic material forming the Y.

In response to the reorientation of a magnetic field generally in the plane of the magnetic medium, bubble domains will travel along the magnetic element or elements defining the transfer switch to trace paths characterized by the letter Y. One, or more, paths can be made to be preferred in the absence of control current in the conductor crossing the propagation path defined along the stem of the Y.

As will be readily appreciated, the magnetic elements forming the transfer switch can be varied in shape, width, length, thickness, and number, as long as the propagation paths defined by these elements generally trace the letter Y. Further, the exact location of the conductor in the transfer switch can be varied in different designs, it being understood that it generally crosses the propagation path which is along the stem of the Y.

The exact shape of the "Y" formed by the various propagation paths in the transfer switch is not critical. It could be a symmetrical "Y" in which the propagation path along the stem of the Y bisects the angle between the propagation paths along the arms of the Y, or it could be an asymmetrical Y in which the stem propagation path does not bisect the angle between the arm propagation paths. Generally, however, the angle between the stem propagation path and either one of the arm propagation paths is not 90°, but is between 90° and 180°. The angle between the arm propagation paths is not critical and is greater than 0° but less than 180°.

In addition to the considerations above, the lengths of the magnetic elements forming the arms of the Y do not have to be equal, and do not have to have the same thicknesses or widths. All of these considerations can be used by the designer to provide the most effective transfer switch for any situation. For example, if the transfer conductor crossing the stem of the Y is too close to the arms of the Y, it will be too far from the bottom of the stem to affect a bubble domain located there. If, however, the conductor is too close to the bottom of the stem, then the magnetic field produced by current in it may not create a sufficiently large potential well for affecting the bubble motion.

In a particular embodiment, this transfer switch is used to transfer bubble domains between a major loop and minor loops in a major/minor loop memory organization. The transfer switch can be an integral part of the propagation structure used for moving bubble domains in the minor loops and in the major loop, and can be formed by processes in which high and low resolution masking are used. The switch is compatible with presently used types of propagation elements and is easily adapted to various design structures. Its low current requirement for reliable switching means that it can be used in bubble storage devices using very small magnetic bubble domains, without requiring currents that are excessive.

These and other objects, features, and advantages will be more apparent from the following more particular description of the preferred embodiments.

BRIEF DESCRIPTION OF THE DRAWINGS

FIG. 4 is a detailed diagram of an expander/detector for sensing bubble domains removed from the minor loops, as well as the propagation circuitry for taking bubble domains from the output shift register SR2 to the expander/detector.

DETAILED DESCRIPTION OF THE PREFERRED EMBODIMENTS

FIG. 1

Figure 1:
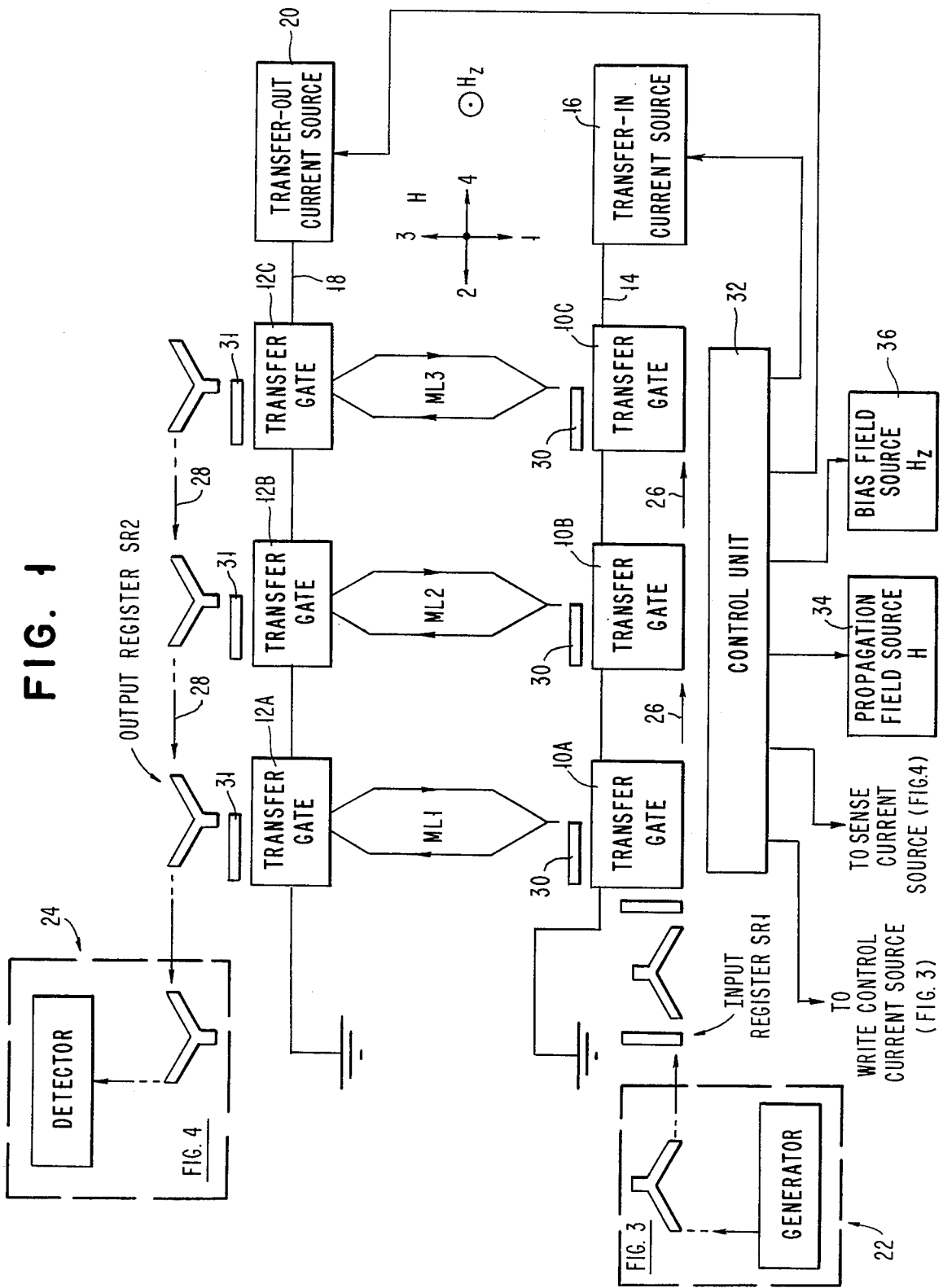
FIG. 1 shows a schematic representation of a major/minor loop memory using the novel transfer gates of the present invention.

FIG. 1 illustrates a magnetic bubble domain storage device in which a plurality of storage shift registers are used in combination with input/output registers for efficient storage of information. The information is represented by magnetic bubble domains which can be coded in several ways for representation of information, as is well known in the art. In particular, such domains may be coded in terms of presence/absence for representing one and zero bits of a binary system. In particular, FIG. 1 represents a major/minor loop type of memory organization.

In more detail, a plurality of storage registers, designated minor loops ML1, ML2, and ML3 are provided for storage of magnetic bubble domains. In accordance with the principles well known in the art, any number of minor loops can be used, although only three are shown in this figure. Information represented by bubble domains can be selectively transferred to the minor loops by the input transfer gates 10A, 10B, and 10C. Removal of information from the minor loops is accomplished by the output transfer gates 12A, 12B, and 12C. In order to change the path of bubble domains through the input transfer gates 10A-10C, current is provided in conductor 14, which is connected to the transfer-in current source 16. Correspondingly, current in conductor 18, which is connected to the transfer-out current source 20, is used to change the propagation path of domains through the output transfer gates 12A-12C.

Figure 3:
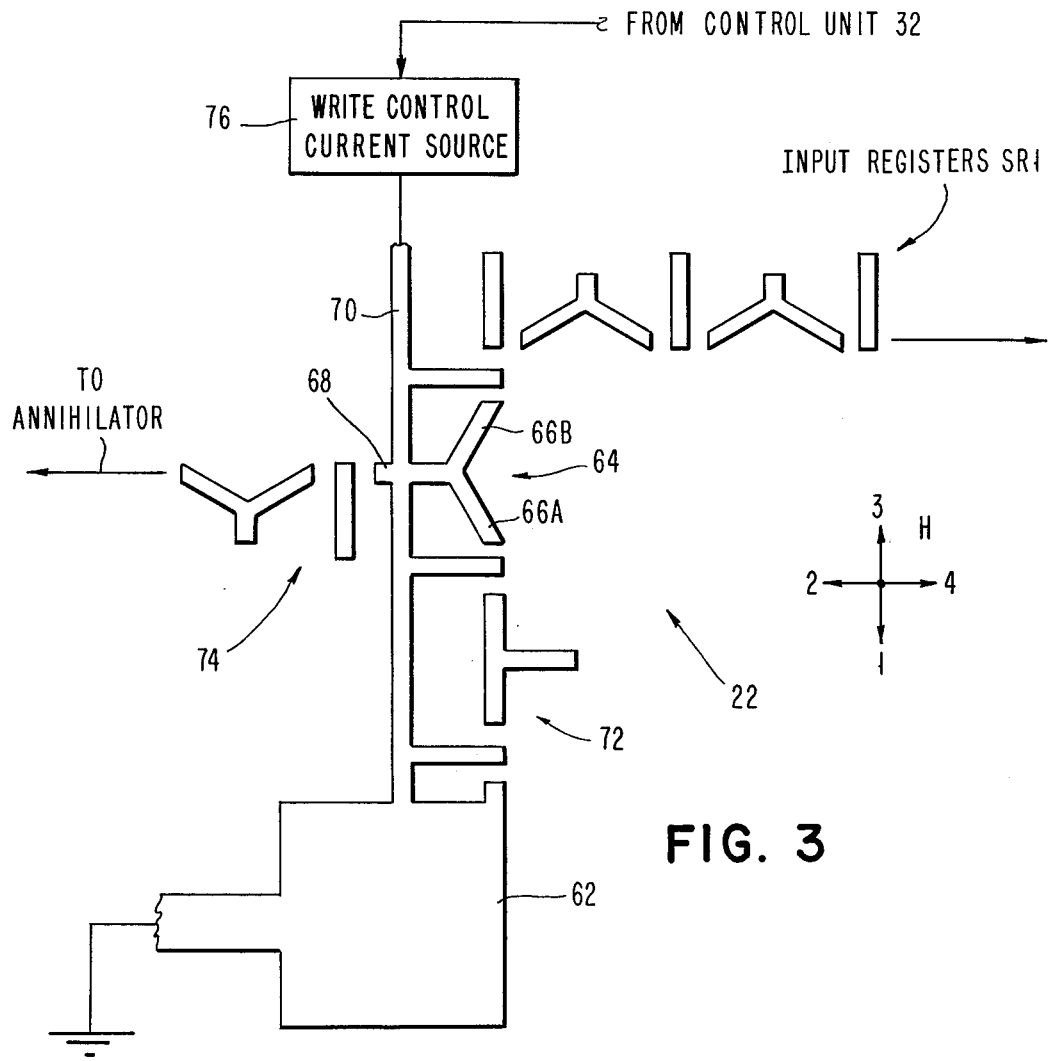
FIG. 3 is a detailed diagram of the bubble domain generator and propagation circuitry for moving bubble domains to the input shift register SR1 of FIG. 1.

Coded information represented by bubble domains is provided by the bubble domain write control circuit 22, which is shown in more detail in FIG. 3. A bubble domain read circuit 24 is used to sense information taken from the minor loops and is shown in more detail in FIG. 4.

An input register SR1 is used to bring information from the bubble domain write control circuit 22 to the appropriate input transfer gates 10A-10C for delivery to the appropriate minor loops, while an output register SR2 is used to deliver information taken from the minor loops to the read circuit 24. In FIG. 1, input register SR1 is comprised of magnetic elements which move bubble domains in the direction of arrows 26, in response to the reorientation of a magnetic field H in the plane of the medium in which the bubble domains move. Any type of well known propagation circuitry can be used for this function. In a similar fashion, output register SR2 is comprised of bubble domain propagation elements which move bubble domains to the left in the direction of arrows 28 in response to reorientation of magnetic field H. In FIG. 1, the input register SR1 and the output register SR2 are comprised of Y-I magnetic elements.

In FIG. 1, the magnetic elements 30, located between each input transfer gate and its associated minor loop, bring bubble domains to the associated minor loop. That is, they aid in the propagation of a domain from register SR1 to the associated minor loop. Correspondingly, magnetic elements 31 aid in the propagation of bubble domains from output transfer gates 12A-12C to output register SR2.

A control unit 32 is used to provide start and synchronization pulses to the transfer current sources 16 and 20, as well as to the sense current source (FIG. 4) and the write control current source (FIG. 3). Thus, control unit 32 regulates operation of the storage structure of FIG. 1 in order to provide the write function, transfer function, and read function. Control unit 32 also provides control signals to the propagation field source 34 and the bias field source 36. Source 34 produces the drive magnetic field H while source 36 produces the magnetic field $H_z$ used to stabilize the size of domains in the storage device. These components are well known in the art and need not be described further.

FIG. 2

Figure 2:
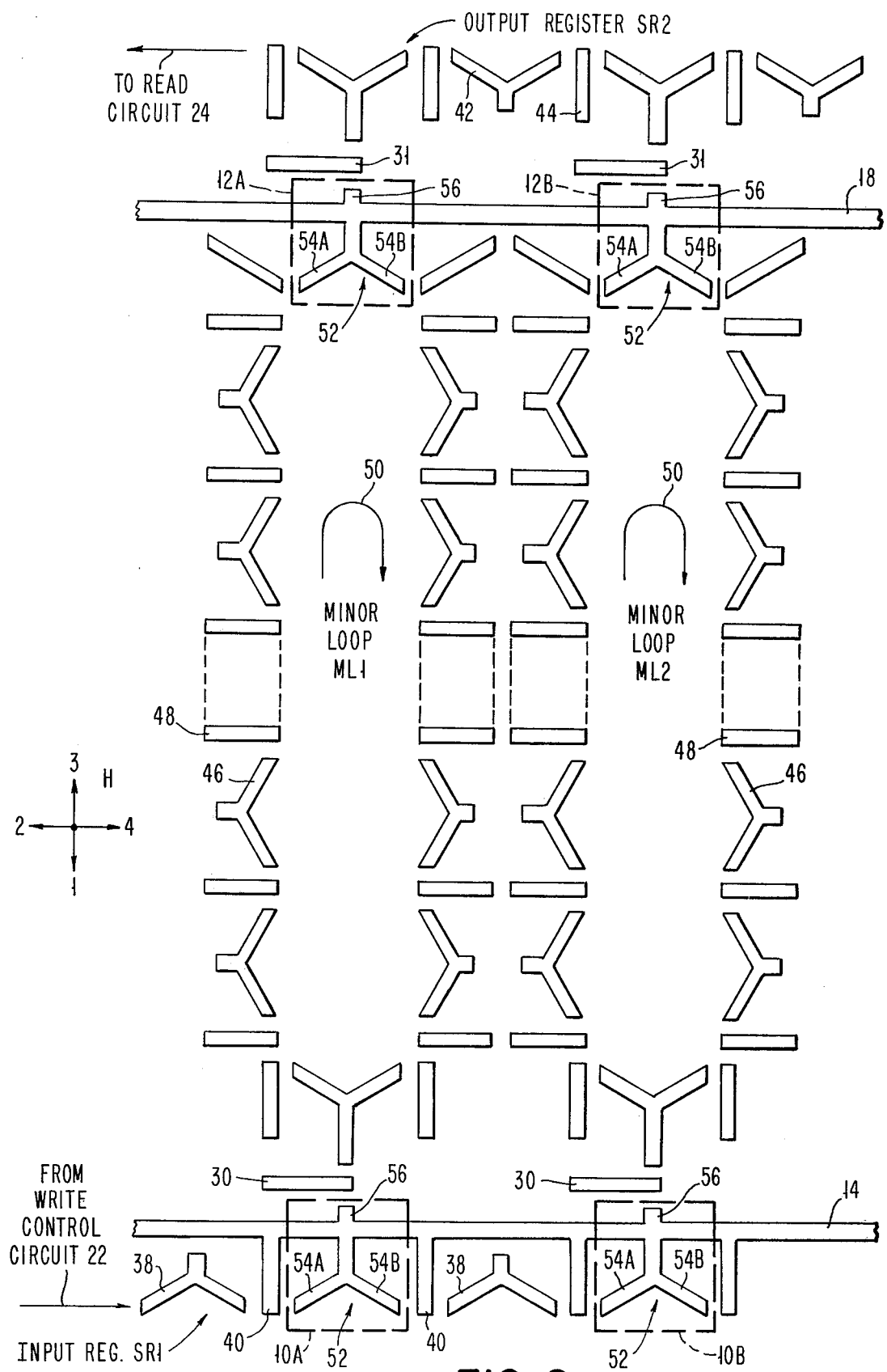
FIG. 2 shows a portion of the memory of FIG. 1, and in particular illustrates the transfer switches and propagation structure for moving magnetic bubble domains in the input and output shift registers and in the minor loops.

FIG. 2 shows a detailed circuit diagram of input register SR1, output register SR2, two minor loops, input transfer gates 10A and 10B, and output transfer gates 12A and 12B. For ease of illustration, the third minor loop and its associated transfer gates are not shown in this drawing. In more detail, input register SR1 is comprised of Y-bar magnetic elements 38 and I-bar elements 40. Typically, these magnetic elements are comprised of NiFe, as is well known in the art. When magnetic field H reorients in phases 1, 2, 3, and 4, domains from write control circuit 22 propagate to the right in input register SR1.

Output register SR2 is comprised of Y-bar elements 42 and I-bar elements 44. Again, these are magnetic elements typically comprised of NiFe. When field H continually reorients through phases 1-4, domains in register SR2 move to the left to the read circuit 24.

Minor loops ML1 and ML2 are comprised of Y-bar elements 46 and I-bar elements 48. When field H reorients as illustrated, domains in the minor loops move around the loops in a clockwise direction, as indicated by arrows 50.

Input transfer gate 10A is used to transfer bubble domain information from input register SR1 to minor loop ML1, while input transfer gate 10B transfers bubble domain information from register SR1 to minor loop ML2. Correspondingly, output transfer gate 12A is used to transfer information out of minor loop ML1 to output register SR2, while output transfer gate 12B transfer information from minor loop ML2 to register SR2.

As is also apparent from FIG. 1, magnetic I-bars 30 are located between the input transfer gates and the associated minor loops, while magnetic I-bars 31 are located between the output transfer gates and the output register SR2.

The transfer gates provide bubble domain paths which essentially trace out the letter Y. In the embodiment of FIG. 2, the transfer gates are comprised of Y-shaped magnetic material, such as NiFe. Thus, the magnetic elements, generally designated 52, are comprised of two arm portions 54A and 54B, and a base or stem portion 56. A current carrying conductor crosses the stem portion 56 of element 52. In FIG. 2, the conductor 14 passes across the stem portion 56 of the magnetic elements 52 in input transfer gates 10A and 10B, while conductor 18 crosses the stem portions 56 of the Y-bar elements of output transfer gates 12A and 12B.

In operation, bubble domains can move from arm 54A to arm 54B, or from arm 54A to stem 56, as the magnetic field H reorients. Further, whether the bubble domains pass from one arm to the other or from one arm to the stem of the element 52 depends upon the presence or absence of current in conductors 14 and 18, respectively.

Figure 2A:
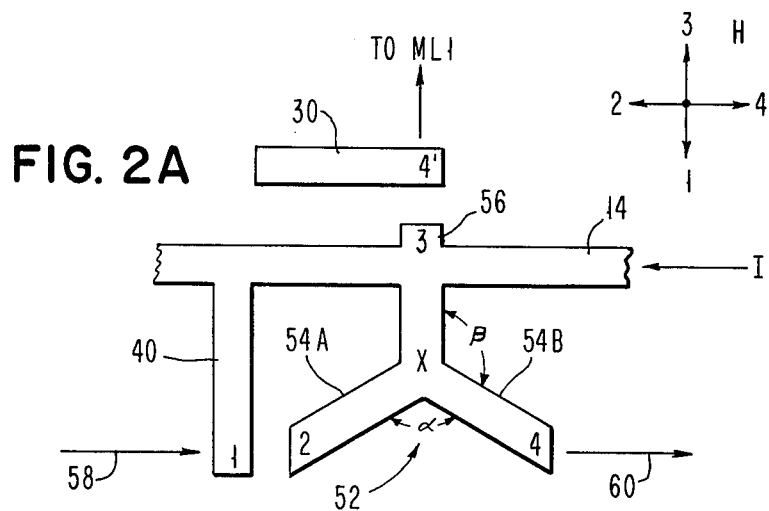
FIG. 2A is an expanded view of a transfer switch, used to illustrate the operation of this switch.

The operation of a representative transfer gate is shown more clearly in FIG. 2A. In this FIG., the same reference numerals are used as were used in FIG. 2, in order to facilitate explanation. Thus, the transfer gate shown in FIG. 2A is illustratively transfer gate 10A.

Bubble domains move in the direction of arrow 58 toward the transfer element 52 as field H reorients. A bubble domain located at pole position 1 of I-bar 40 will move to pole position 2 on arm 54A of Y-bar 52 when field H is in phase 2. In the absence of a current in conductor 14, this bubble domain will travel along arm 54A to pole position 3 of stem 56. As field H moves to phase 4, the bubble domain will then move to magnetic pole 4' on the end of I-bar 30. This occurs since pole 4' is closer to the end of stem 56 than is pole 4 at the far end of arm 54B. Thus, with no current in conductor 14, bubble domains travel along arm 54A, along stem 56, and then to I-bar 30.

If a current is present in conductor 14 between field phases 2 and 3, a bubble domain at pole 2 of arm 54A can still get to pole 3 at the end of stem 56, but when the field H reaches phase 4 the magnetic field produced by current in conductor 14 will send the bubble domain to pole 4 at the end of arm 54B. As field H continues to reorient, the bubble domain will move in the direction of arrow 60 and will consequently not be transferred into minor loop ML1. Thus, if a current is present in conductor 14, bubble domains proceed from one arm 54A of Y-bar 52 to the other arm 54B of the Y-bar.

Since this is a symmetrical switch, the margins for bubble domain movement in any of the desired propagation directions are substantially the same. The same switch can be used throughout the storage device in any functional circuit of the device.

Bubble Domain Write Circuit (FIG. 3)

The write circuit 22 provides a selected pattern of bubble domains to the input register SR1, where the presence/absence of domains can be representative of binary information to be stored in the various minor loops. In this write circuit, a conventional replicator type of bubble generator 62 is comprised of a large magnetic element, typically NiFe. As the magnetic field H reorients in the plane of the magnetic medium, a single bubble domain is provided during each cycle of drive field H.

The write circuit 22 also includes a transfer switch 64, which is similar to the transfer switches described previously for movement of bubble domains into and out of the minor loops. Transfer Y-bar 64 includes arms 66A and 66B, as well as a stem or base portion 68. A conductor 70 intercepts the stem portion of switch 64. In this design, the conductor layer is provided in the same mask used to provide the various propagation elements and generator 62. It can overlie the magnetic elements comprising generator 62 and the propagation elements, be beneath that magnetic material layer, be sandwiched by the magnetic material, or be coplanar with it in the area of switch 44.

Propagation circuitry 72 is used to transport bubble domains from generator 62 to the transfer switch 64. Depending upon the state of switch 64, bubble domains are either sent to the input register SR1 or are sent to an annihilator via propagation circuitry 74. Conductor 70 is electrically connected to a write control current source 76.

Write control current source 76 is used to provide current in conductor 70, which in turn determines whether or not switch 64 allows domains to pass to the input register SR1, or sends the domains to an annihilator. Control unit 32 provides a control input to the current source 76 in order to determine the pattern of information to be sent to input register SR1.

In operation, generator 62 produces a single bubble domain during each cycle of rotation of field H. These domains pass to the propagation circuitry 72 and move to the switch 64. Without current in conductor 70, domains entering switch 64 along arm 66A pass to the stem 68 during field phase 2, and then move along the propagation circuitry 74 to an annihilator. However, if current is present in conductor 70, domains will be sent from arm 66A to arm 66B, rather than going to pole 2 on the stem portion 68 of the switch. Thus, when current is present in conductor 70, bubble domains will be sent to input register SR1.

Read Circuit 24 (FIG. 4)

Read circuit 24 is used to sense information removed from the storage loops Ml1 . . . when this information is removed from the storage loops by the output transfer gates 12A, 12B, etc. This is a basic magnetoresistive sensing device using an active sensor S and a dummy sensor D for noise compensation.

In more detail, read circuit 24 is comprised of chevron propagation elements 78, commonly of NiFe, which move magnetic bubble domains from the output register SR2 to the bubble sensor S. As the number of chevrons in each column of chevrons increases, bubble domains will stripe out along the columns of chevrons and thus be expanded to provide an amplified output signal.

The sensor S and dummy sensor D are portions of a thin magnetoresistive strip 80, which is electrically connected at one end to the sense current source 82, at the other end by a ground connection 84, and at its center by another ground connection 86. Magnetoresistive strip 80 is typically NiFe of about 200 Angstroms thickness. As is known in the art, thick film sensors can also be used.

In operation, bubble domains propagate along chevron elements 78 and pass beneath the sensor S while a current is passed through magnetoresistive strip 80 from the sense current source 82, in response to a triggering input from control unit 32 (FIG. 1). This passage of bubbles causes a change in the resistance of the magnetoresistive material 80 which is manifested as an output voltage V. As is well known in the art, the dummy sensor D, comprising that portion of magnetoresistive material 80 between the center ground connection 86 and the right-hand ground connection 84, is not magnetically coupled to the bubble domain to be sensed but provides noise compensation to balance out the noise produced by the rotating magnetic field H.

After being sensed, the domains propagate to an annihilator (not shown). Thus, the storage unit illustrated provides destructive read-out with new information being produced by the write circuit 22.

Figure 5A:
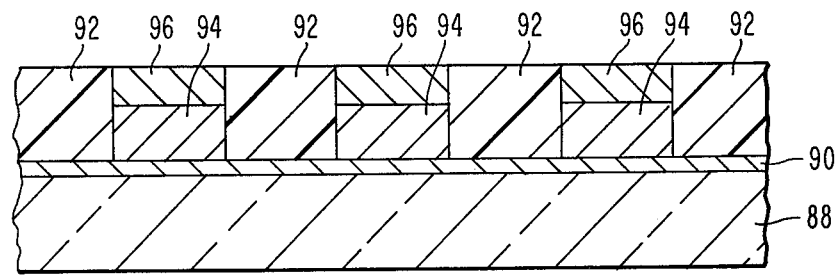
FIGS. 5A-5C illustrate a single level masking technique for making the memory of FIG. 1.
Figure 5B:
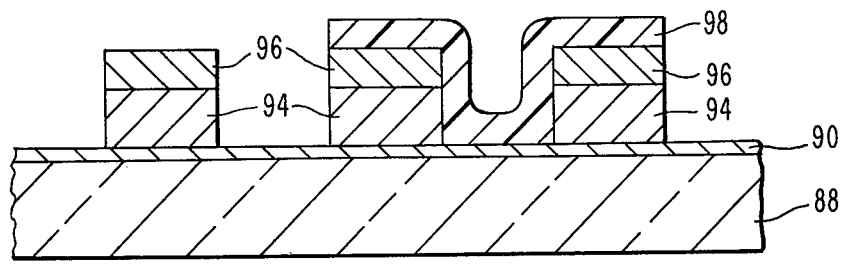
Figure 5C:
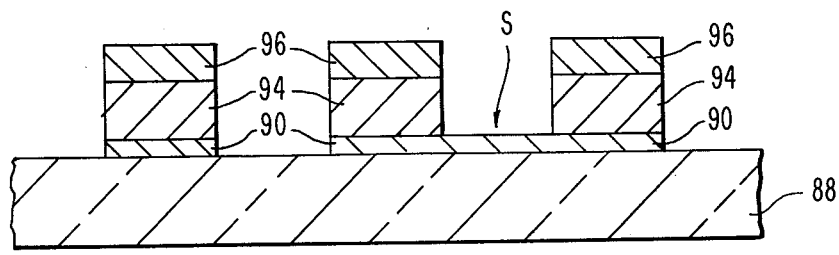

As will be apparent from FIGS. 5A–5C, showing a representative fabrication process, the thin magnetoresistive strip is about 200 Angstroms in thickness, while the magnetic propagation elements, such as the Y and I-bars, as well as the various chevron elements, are about 3,000 Angstroms in thickness. Conductor layers are typically 5,000–10,000 Angstroms in thickness.

Single Level Fabrication (FIGS. 5A–5C)

These figures illustrate a process for fabricating the storage system of FIG. 1, using only a single critical masking step.

In more detail, a bubble domain medium 88, such as a garnet or any other bubble supporting material, has a layer 90 of NiFe evaporated thereon. Layer 90 is typically a magnetoresistive material, a portion of which can be used for the magnetoresistive strip 80 (FIG. 4). Layer 90 also serves as a plating base for the formation of other metallic layers.

Although it is not shown in FIG. 5A, an insulator layer such as SiO$_2$ of approximately 1,000 Angstroms, can be provided on the bubble domain layer 88. If the bubble medium 88 is an amorphous magnetic material, such as insulator layer would be used to provide electrical isolation between overlying conductors and the amorphous material, which is generally a metallic conductor.

A resist mask is formed in the resist layer 92. This is a high resolution mask used to provide very small linewidth elements, such as are used for the various propagation elements and transfer switches of the storage device of FIG. 1. The resist mask 92 can be formed by any high resolution technique, such as by X-ray, or electron beam exposure.

A first layer 94 of a conducting material, such as gold, is then electroplated through the mask 92. For this purpose, continuous layer 90 serves as a plating base. The thickness of the conductor patterns 94 is typically 5,000–10,000 Angstroms. The conductive layer 94 serves for the conductors, such as 14 and 18 (FIG. 1) and for the sensor leads, write control circuit, and other places where conductive material is required.

The overlying magnetic layer 96 is then plated through the same mask 92. Layer 96 is a magnetic material which is used for propagation of magnetic domains and for the generator 62. Typically, it is a magnetically soft material such as NiFe and the thickness of layer 96 is approximately 3,000 Angstroms. The resist mask 92 is then removed chemically and a second mask 98 (FIG. 5B) is used to protect the sensor area. Mask 98 is typically a low resolution mask, such as a photoresist. Normal photon exposure can be used because of the sensor dimensions and alignment tolerances. The critical alignment of the sensor protect mask 98 will be in keeping the sensor from being skewed and thus intercepting more than one bubble. The registration accuracy presently available to do this is easily done using standard photolithographic techniques.

The portions of the thin layer 90 not protected by the mask 98 or the layers 94 and 96 are then removed, using for example, sputter etching or ion milling. Of course, some parts of the exposed portions of layer 96 are removed, but layer 96 is initially thick enough that removal of some of this material during the etching step will not adversely affect the elements to be formed in that layer.

After the etching step, the structure of FIG. 5C is provided. A portion of thin NiFe layer 90 serves as the sensor S. The propagation elements are formed by magnetic layer 96 and the various conductors, contact leads, etc., are portions of the conductive layer 94.

Thus, the transfer gates comprising Y-bar elements are comprised of a layer of a conductor located close to the magnetic material 88, over which is deposited a magnetic layer 96 used to move magnetic bubble domains through the transfer gate. This is a "conductor first" switch, where the conductor layer is located closer to the bubble material than is the magnetic layer. Of course, it will be readily appreciated that the reverse can also be easily provided, or that the conductor can be coplanar or sandwiched with the magnetic layer in the stem portion of the Y-bar switch.

The thin layer 90 of NiFe does not affect the operation of the transfer switches. Its demagnetizing field closes through the top layer 96 and through the bubble domain material. Since it is so thin with respect to the thickness of layer 96, its influence will essentially not be seen, so that the switches shown in cross-section by FIG. 5C are essentially "conductor first" switches.

The transfer switches of the present invention can be made using other standard techniques, such as those employing two masking steps. The use of multiple masking steps for making bubble domain storage devices is well known in the art, and typically uses "lift-off" techniques. These variations in processing will not be described herein, as they are well reported in the literature.

FIG. 6

Figure 6:
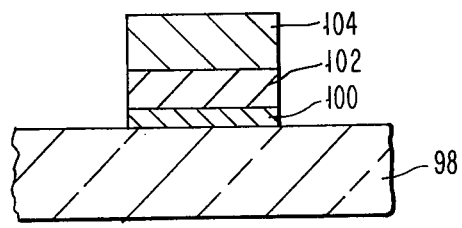
FIG. 6 is a cross-sectional view of a transfer switch, comprised of two magnetic layers and a conductor layer.

The transfer switch of the present invention can be comprised of three layers, two of which are magnetic. Thus, an illustrative example is NiFe-gold-NiFe. Such a structure is illustrated by FIG. 6, in which the bubble domain material 98 has a first magnetic layer 100 thereon, over which is formed a conductor layer 102. Finally, the top layer 104 is a magnetic material. Usually, magnetic layers 100 and 104 are comprised of magnetically soft material such as NiFe, while the conductive layer 102 is, for example, gold.

As the bubble domain size decreases to a micron and less in diameter, propagation and switching devices have to be made smaller. Good transfer switches require that the conductor used in the transfer switch be deposited very near the bubble domain material. This would typically require that the propagation magnetic material be placed on top of the conductor. However, as bubble domains become smaller, the separation between the bubble domains and the propagation magnetic layer has to be reduced. In the case of a half-micron diameter bubble domain, a separation of more than 1,000 Angstroms would not be desirable. This problem is especially apparent in the case of amorphous bubble domain films where an insulating layer must be used over the film. On the other hand, placement of the magnetic propagation structure close to the bubble domain material can cause problems because the magnetic flux of the magnetic material and the magnetic flux associated with current through the conductive layer are then 180° out of phase.

The laminate structure of FIG. 6 has the propagation magnetic layer 100 close to the bubble domain material, and the conductor layer 102 located thereover. A thick layer of magnetic material 104 is deposited over the conductor transfer line 102. Since layer 104 is thicker than layer 100, the gradient fields for bubble domain transfer produced by current in the conductor 102 and the field from the top layer 104 are in the same direction. During transfer, the top and bottom magnetic layers 100 and 104 switch anti-parallel and magnetically close on each other; however, since the top layer 104 is thicker than the bottom layer 100, all of its stray magnetic field is not closed. This stray field is in phase with the conductor stray field and thereby increases the transfer field that acts on the bubble domain.

Layers 100, 102, and 104 can be provided through the same mask, thereby providing single masking level fabrication.

An an alternative, an all magnetic material switch can be provided, in which the transfer conductor (such as conductor 14 of FIG. 2) is comprised of the same magnetic material as used to provide the arms and stem of the transfer switch.

Examples

The present transfer switches provide efficient bubble domain transfer using very small currents even when very small bubble domains are used. For example, transfer of sub-micron domains can be performed with these switches.

In the Y-bar switch (FIG. 2A), current through a conductor crossing the base leg of the Y determines whether a bubble passes from one arm to either the base or the opposing arm of the Y. In the absence of a switch current, a clockwise rotating in-plane field will cause a bubble to proceed from the left in the lower path, through the Y-bar of the switch, and then to I-bar 30. Thus the path 1-2-3-4' will be followed. On the other hand, in the presence of adequate current of the correct sense, the bubble will be forced to remain in the lower path, following the sequence 1-2-X-4. The choice of path is made when the bubble is in the vicinity of the base of the Y. Detailed studies of the operating margin and failure modes were made for various values of the phase, pulse length, and magnitude of the switching current I. It was established that the current in the conductor did not serve merely to prevent the bubble from reaching position 3 at the end of the base 56 of the Y-bar, so that it would never pass to position 4' on I-bar 30. On the contrary, the bubble could in fact reach position 3 at phase 3 of the in-plane field H and still be inhibited from permanently going to position 4' if adequate current were applied between phases 3 and 4. In this case a sufficiently deep potential well was formed at position X by the current-induced field to force the subsequent retraction of the bubble from position 3 to position X; when the field rotated to the direction indicated by phase 4 the bubble then passed from position X to position 4 instead of 4'.

In the critical switching phase, two attractive positions, X and 3 on stem 56, are presented to the bubble. The pole at 3 is created by the drive field, while the pole at X originates in the action on the bubble of the field from the switching current. The bubble will reside in the lower of the two energy states represented by positions 3 and X; the relative energies depend on the magnitudes of the drive field and the switch current. If the phasing is such that the bubble is at X while the pole 4' is turning on, the bubble will subsequently pass on to 4 and along arrow 60 instead of going to 4' then to ML1. (Late turn on results in suppression of the successful operating region because the bubble has already passed to position 4' before the switch current makes position X attractive).

This explains the pull-back effect, since successful switching can occur after the bubble attains position 3 at the end of stem 56 if the switch current which is subsequently applied is adequate to make position X more attractive than position 3.

Since the pole strengths at the permalloy bars (e.g., at position 3) increase with increasing drive field, the region of best switching is confined to low values of drive field and expands as the magnitude of the switch current is increased.

The field from the conductor opposes the field from the pole which is created by the in-plane field at the base of the Y-bar. The switching currents $I_s$, when plotted as a function of the in-plane field H, may be fitted by a straight line. The behavior of the switch may be described by the slopes of these curves, i.e, the constant of proportionality K between the required switching current $I_s$ and the in-plane field H, $$H = K I_s. \tag{1}$$

Small-Bubble Switches

It is desirable to design a switch with a very high value of the switch constant K, since for a given value of in-plane field H only a relatively low switch current $I_s$ will be needed under these conditions. This is particularly important for small bubbles, where fabrication considerations may make it difficult to achieve high values of switching currents.

The general scaling law for switches was derived heuristically according to the following argument: For good operating margins the bubble diameter D may be taken as $$D = 8(2/\pi)^{1/2}(AQ)^{1/2}/M_B. \tag{2}$$

where $M_B$ is the bubble magnetization, Q is the ratio of the anisotropy field to $4\pi M_B$, and A is the exchange constant. Since A and Q are maintained constant as the bubble diameter D decreases, D is proportional to $1/M_B$. The bubble induces a magnetic image in the Permalloy Y-bar, thus causing the bubble to be bound to the Permalloy with an energy proportional to $M_B^2$. During propagation, it is the function of the in-plane field H to overcome the effect of this potential well. Since the corresponding field-induced bubble energy is proportional to $HM_B$, H must vary as $M_B$, so that as the bubble diameter is reduced, H must vary as 1/D (see Eq. (2)).

It is the function of the current in the switch conductor to provide a field $H_s$ which counteracts the effect of the in-plane field H so that the propagation of the bubble is significantly affected. For successful switching then, $H_s$ is proportional to H. Since, from above, H is proportional to 1/D, $H_s$ is also proportional to 1/D for successful switch operation.

$H_s$ is proportional to $I_s/W$, where $I_s$ is the switching current and W is the width of the conductor. Since W is directly proportional to the bubble diameter D, $H_s$ is also proportional to $I_s/D$. However, $H_s$ must be proportional to 1/D for successful switch action. This condition can therefore be fulfilled only if the switch current $I_s$ is maintained constant as the bubble diameter decreases.

To check this heuristic argument for the Y-bar switch, a Y-bar switch (in the conductor-first mode) was designed for two-micron bubbles. The permalloy and conductor thicknesses were both taken as 0.3 microns, the spacer thickness (between the conductor and the bubble film) was 0.35 microns, and the protrusion distance of the base of the Y beyond the conductor was 1.0 micron. Other pertinent parameters of this switch are given in Table I, where it is also noted that a switch constant of 8.55 oe/ma is obtained.

(using a "shorter" bubble) or by decreasing the spacer thickness. When the two micron bubble case is taken as a standard, and comparison is made with the case of a bubble of half the thickness, and with the case of a spacer of half the thickness, analysis shows that the same switch constant is obtained for all cases. The decrease of field with distance from the conductor is slow and is apparently counterbalanced by the corresponding increase in the value of $\Delta H_B$ (the effective bias field change on the bubble).

TABLE I

ILLUSTRATING SCALING LAW
(Non-SLM Configuration)

| Bubble Diam. D ($\mu$) | Bubble Film h ($\mu$) | Spacer Thickness S ($\mu$) | Bar Width W ($\mu$) | Stem Bar Length L ($\mu$) | NiFe Thickness t ($\mu$) | Conductor Thickness e ($\mu$) | $4\pi M$ (g) | Switch Constant K oe/ma |
|---|---|---|---|---|---|---|---|---|
| 2 | 2 | 0.35 | 1 | 7 | 0.3 | 0.3 | 400 | 8.55 |
| 1 | 1 | 0.175 | 0.5 | 3.5 | 0.3 | 0.15 | 800 | 17.1 |

For the case of a bubble chip scaled down by a factor of two to accommodate one-micron bubbles, the pertinent dimensions are also given in Table I, where it is seen that a switch constant of 17.1 oe/ma is obtained, exactly twice the switch constant found for the two-micron bubble, thus indicating that K is proportional to 1/D. However, as pointed out above, it is anticipated that for propagation double the in-plane field will be required for the one micron case compared with the two micron case, so that the switch current $I_s$ needed for successful operation will be identical in the two cases.

Since the dimensions of the conductor decrease when the device is scaled for use with smaller bubbles, the scaling law implies a corresponding increase in current density. Further, since there is an upper limit to the value of the current density which may be used in practice, it is important to design switches for as high a value of the switch constant K as possible. In the examples considered, the maximum usable current density was considered to be set by the electromigration limit, which was taken as $10^7$ amp/cm$^2$.

Under this assumption, the scaling of the conductor-first design may be considered for bubbles other than two microns in the diameter. Here, H(typ) is the typical in-plane field giving good propagation margins, and is obtained by assuming H=50 oe for the two-micron case, and that H is proportional to 1/D. The curve of maximum current $I_s$(Mas) vs D was obtained under the condition of direct proportionality of the conductor thickness and width with bubble diameter, so that under the assumption of current density fixed at the electromigration limit $I_s$(max) is proportional to $D^2$. Since the switch constant K is inversely proportional to D (see Table I), from Eq. (1) H(max), the maximum in-plane field for which successful switching is possible, increases linearly with D. Thus, the intersection of the H(max) and H(typ) curves gives 0.88 microns as the smallest useable bubble diameter for the conductor-first configuration. If there is a relative increase in the thickness of the conductor as the device is scaled down, a smaller bubble limit is achievable.

Since the field from the conductor decreases with increasing distance from the conductor, it might be thought that a larger switch constant could be obtained if the effective spacing between the conductor and the bubble were decreased. This goal may be accomplished either by decreasing the thickness of the bubble film

SLM Y-Bar Switches

Multi-level masking is presently impractical with electron-beam related lithography methods used for the fabrication of small bubble devices because adequate mask-alignment methods are not available. Instead, the conductor and the Permalloy must overlay one another because only one mask is used in the SLM fabrication process. Thus each layer is confined to a single plane, and the propagation as well as the switch elements have the identical sequence and thickness of the various layers. (It is assumed that the conductor is made of a metal, e.g., gold, which has a sufficiently high conductivity so that nearly all the current flows through it, rather than through the Permalloy).

Under the SLM condition, four possible conductor-first configurations are possible). (For quantitative comparison with the non-SLM conductor first configuration, the spacing between the bottom of the Permalloy layer and the top of the bubble film is considered fixed).

1. SLM Conductor-First No. 1. Here the conductor is between the Permalloy and the bubble film, just as in the non-SLM conductor-first case but without the "bridging" feature of the latter configuration. It is advantageous to fill with the conductor layer the maximum fraction of the space between the conductor and bubble layers. However, in order to use amorphous bubble films (which are electrically conducting), in addition to the conductor film it is necessary to interpose an insulating film between the Permalloy and bubble films. It is assumed that half of the space between the latter film is taken by the conductor, and half by the insulating film.

2. SLM Conductor-First No. 2. Here the insulating film is omitted completely, so that the spacer layer between the Permalloy and bubble films becomes the conductor film. This configuration is thus useful only for a garnet bubble film, since the latter is an insulator.

3. Permalloy First. Here the Permalloy film is between the conductor and the bubble film. According to the assumptions about the Permalloy made in the present calculations, all of the flux from the conductor will flow through the Permalloy so that none will be available to switch the bubble; i.e., the Permalloy acts as a perfect magnetic shield. Experiments show that such switches do in fact work, but only at a considerably higher current than do other configurations.

4. Permalloy Only. Here there is no special conductor layer, so that the current flows entirely through the Permalloy film. In the analysis of this configuration it will be assumed that the fields produced by the current are the same as those which would flow through a non-magnetic conductor having the dimensions of the Permalloy film. This assumption arises from the realization that a current in the bottom portion of the Permalloy may be imaged in the top portion, but the current in the top portion will not contribute any field to the bubble because the bottom portion will provide magnetic shielding. The two effects thus cancel.

The values of K are higher for the SLM conductor-first cases than the non-SLM conductor-first case, presumably because the unchanged Permalloy-bubble spacing but decreased conductor-bubble spacing makes the conductor relatively more effective in the former cases. The Permalloy-only case involves a value of K which is roughly a factor of two lower than that of the non-SLM conductor-first case; such a result is expected because of the lack of an image current in the former case.

On the other hand, because of the geometries involved, more current can flow through the conductors of some of these configurations compared with the others. The net result is that the largest in-plane field which can be counteracted in switching is associated with the SLM conductor-first no. 2 configuration, while the lowest is associated with the Permalloy-only configuration. The SLM conductor-first no. 2 configuration provides successful switching for the smallest bubble diameter ($0.7\mu$).

All of the above configurations employed modest (0.3) values of the aspect ratios, i.e., the ratios of the thickness to width of the conductor and Permalloy layers. If the lithographic methods are improved, e.g., with conformable mask or X-ray lithography, so as to provide increased aspect ratios, direct benefit will be obtained for small-bubble switches employing the non-SLM conductor-first and SLM Permalloy-only configurations. (Increased aspect ratios cannot provide improvement in the SLM conductor-first configuration since the spacer between the Permalloy and bubble films is fixed at a thickness which permits good propagation margins).

For a given bubble diameter (and hence fixed value of conductor width W), the value of H(max) is directly proportional to $K \cdot e$, the product of the switch constant and the conductor thickness. $D_{min}$ (minimum bubble diameter) asymptotically approaches a value of 0.4 to 0.5 micron for aspect ratios in the range of 2 to 3. (The potential-well model employed for the Permalloy-only case begins to lose its validity for aspect ratios to 2 to larger). These values of $D_{min}$ are significantly lower than those obtained from the SLM conductor-first designs with modest aspect ratios.

Switch designs based on principles somewhat different from those described here may offer substantial advantages. For example, the field created by the current in the described switch directly serves to oppose the influence of the in-plane field. If the Y-bar switches were redesigned to be more symmetric, the two alternative bubble paths will be associated with roughly equivalent field-induced poles in the "decision region" of the switch. In that case the switch current would be employed only to "tip" the bubble into one of the alternative paths, so that a much smaller switching current would be required compared with that described. This or other modifications would permit switching of bubbles smaller than projected above for the illustrated Y-bar switch, and are within the general scope of this invention.

What has been shown is a magnetic bubble domain storage device using an improved transfer switch which can be fabricated by single level masking techniques and which is compatible with many types of propagation patterns. The switch provides reliable transfer margins in all directions, and is characterized by switch propagation paths generally following portions of a Y. Localized control of the path followed by bubbles through the switch is provided by a control means which produces a localized magnetic field for sending the bubble domains along one of the paths through the switch. Thus, whether the transfer switch is comprised of one or several propagation elements and regardless of their shape, width, length, or thickness, the principles of the present invention are as described herein.

What is claimed is:

1. A magnetic bubble domain device for moving magnetic bubble domains in a magnetic medium in response to the application of repetitive cycles of a reorienting magnetic field in the plane of said medium, said magnetic field having a substantially constant magnitude during said cycle of reorientation, comprising:
   a first shift register for moving magnetic bubble domains in said medium;
   a second shift register for moving magnetic bubble domains in said magnetic medium,
   transfer means for transferring bubble domains from said first shift register to said second shift register, or retaining said bubble domains in said first shift register, said transfer means being operative while said magnetic field is present and while said magnetic field continues said reorientation, said transfer means including:
   at least one magnetic element for propagating said bubble domains in said transfer means in propagation paths generally defining the letter Y, a first propagation path being along one arm of said Y and then along the other arm of said Y, and a second propagation path being from one arm of said Y to and along the stem of said Y,
   a narrow conductor located between said magnetic element and said magnetic medium which crosses the propagation path defined along the stem of said Y, said conductor having a width that is less than the length of said stem of said Y, the presence or absense of current in said conductor while said magnetic field is reorienting determining whether said bubble domains go along said first or second propagation path in said transfer means.

2. The device of claim 1, where the angle $\alpha$ between said propagation paths along the arms of said Y is greater than 0° but less than 180°.

3. The device of claim 2, where the angle $\beta$ between each arm of the Y and the stem of said Y is greater than 90° but less than 180°.

4. The device of claim 1, where the angle $\beta$ between each arm of said Y and the stem of said Y is greater than 90° but less than 180°.

5. The device of claim 1, where said first and second shift registers are comprised of gapped magnetic elements, said gapped elements and said at least one magnetic element being separated from said magnetic medium by a layer of the conductive material forming said conductor, said magnetic elements and said underlying conductive material having the same shape and being formed with the same mask during deposition of said conductive material and said magnetic elements.

6. The device of claim 1, where said magnetic element has arms of equal length.

7. The device of claim 1, where the propagation path along the stem of said Y bisects the angle between the propagation paths along the arms of the Y.

8. The device of claim 1, where said transfer means includes a Y-shaped magnetic element for defining said first and second propagation paths through said transfer means.

9. The device of claim 8, where said magnetic element is comprised of a layer of magnetically soft material and said conductor is located between said bubble medium and said layer of magnetically soft material at the location where said conductor and said magnetic material cross one another along the stem portion of the Y formed by said magnetic material.

10. The device of claim 8, where said magnetic element has a liminate structure comprised of a layer of conductive material located between two layers of magnetically soft material.

11. The device of claim 1, where said magnetic element and said conductor and comprised of the same material.

12. The device of claim 1, where said magnetic element is a portion of said first shift register.

13. A magnetic bubble domain device for moving magnetic bubble domains in a magnetic medium in response to the application of repetitive cycles of a reorienting magnetic field in the plane of said medium, comprising:
   a first shift register for moving magnetic bubble domains in said magnetic medium,
   a second shift register for moving magnetic bubble domains in a magnetic medium,
   a transfer switch for transferring bubble domains from said first register to said second shift register, or for retaining said bubble domains in said first shift register, said transfer switch including:
   at least one magnetic element for propagating said bubble domains in said transfer switch along propagation paths generally defining the letter Y, a first propagation path being along one arm of said Y and then along the other arm of said Y, and a second propagation path being from one arm of said Y to and along the stem of said Y,
   a conductor which crosses the propagation path defined along the stem of said Y, said conductor being located between said magnetic element and said magnetic medium and having a width that is less than the length of said stem of said Y, the presence or absence of electrical current in said conductor determining whether said bubble domains go along said first or second propagation path,
   another magnetic element separated from said at least one magnetic element and located near the end of the stem of said at least one magnetic element, said another magnetic element providing an attractive magnetic pole for bubble domains moving along said second propagation path.

14. The device of claim 13, where said transfer switch and first and second shift registers are comprised of first and second non coplanar metal layers, said first layer being located between said magnetic medium and said second layer and being comprised of a non magnetic, electrically conductive material a portion of which is said conductor, while said second layer is comprised of a magnetically soft material.

15. A transfer switch for selectively moving magnetic bubble domains in two different directions in a magnetic medium, comprising:
   propagation means for moving bubble domains along paths which define a Y, one propagation path being from one arm of the Y to and along the other arm of the Y, and a second propagation path being from one arm of said Y to and along the stem of said Y, where the angle $\alpha$ between the propagation paths along the arms of the Y is greater than 0° but less than 180°, and the angle $\beta$ between a propagation path along one arm of the Y and a propagation path along the stem of the Y is greater than 90° but less than 180°,
   current-carrying conductor means for producing a potential well along the stem of said Y and below the intersection of the paths along the arms of the Y in order to determine whether said bubble domains follow said first or second path through said transfer switch, said current carrying conductor being located between said magnetic medium and said Y propagation means and having a width less than the length of the stem of said Y propagation means,
   means for producing a reorienting magnetic field for moving said domains along said propagation means while said potential well is being produced.

16. The device of claim 15, where said means for producing a potential well includes means for creating a localized magnetic field at the region where the propagation paths along the arms of said Y intersect.

17. The device of claim 15, where said means for moving bubble domains includes at least one magnetic element along which magnetic poles are created in response to the reorientation of a magnetic field in the plane of said magnetic medium.

18. A transfer switch for selectively sending magnetic bubble domains along one of two different propagation paths, comprising:
   magnetic means along which magnetic poles can be established by a reorienting magnetic field where the locus of said magnetic poles generally defines the letter Y,
   means for sending bubble domains along a first path which is along one arm of said Y and then along the other arm of said Y,
   means for sending bubble domains along a second path where said second path is along one arm of said Y and then along the stem of said Y,
   control means operative while said reorienting magnetic field is applied for determining whether bubble domains pass along said first path or said second path, where said control means includes a conductor located under said magnetic means along which current can flow, the presence or absence of electrical current in said conductor determining whether said bubble domains go along said first path or said second path, said conductor crossing the stem of said Y and having a width that is less than the length of the stem of said Y.

19. The device of claim 18, where one of said two paths is preferred in the absence of direction from said control means.

20. The device of claim 18, where the angle $\alpha$ between the propagation paths along the arms of said Y is greater than 0° but less than 180°, and the angle $\beta$ between a propagation path along one arm of the Y and the propagation path along the stem of the Y is greater than 90° but less than 180°.

21. A transfer switch for selectively sending magnetic bubble domains in a magnetic medium along one of two propagation paths, comprising:

magnetic means for propagating bubble domains along paths defining the letter Y in response to the application of a magnetic field substantially in the plane of said medium, one of said propagation paths being along one arm of the Y and then along the other arm of the Y, and a second propagation path being along one arm of the Y and then along the stem of the Y, control means for determining whether bubble domains pass along said first propagation path or said second propagation path, where said control means includes a current carrying conductor which extends in a direction across the direction of propagation along the stem of said Y, the presence or absence of current in said conductor while said magnetic field is applied determining the path taken by said bubble domains through said switch, and where said conductor is located between said magnetic medium and said magnetic means and has a width less than the length of the stem of said Y magnetic means.

22. The device of claim 21, where the angle $\alpha$ between the arms of said Y is greater than 0° and less than 180°, and the angle $\beta$ between either arm of said Y and the stem of said Y is greater than 90° and less than 180°.

23. The device of claim 21, where said magnetic means and said conductor are comprised of the same material.

24. The device of claim 21, where said magnetic means has a geometry generally defining the arms and stem of the letter Y.

* * * * *